United States Patent [19]
Hutson

[11] 3,909,926

[45] Oct. 7, 1975

[54] METHOD OF FABRICATING A SEMICONDUCTOR DIODE HAVING HIGH VOLTAGE CHARACTERISTICS

[76] Inventor: Jearld L. Hutson, 907 Newberry, Richardson, Tex. 75080

[22] Filed: Nov. 7, 1973

[21] Appl. No.: 413,542

[52] U.S. Cl. ........................ 29/580; 29/588; 29/589; 148/188; 357/55

[51] Int. Cl.² ........................................... B01J 17/00

[58] Field of Search ............ 29/578, 580, 583, 590, 29/591, 589; 148/188; 357/55

[56] References Cited

UNITED STATES PATENTS

| | | | |
|---|---|---|---|
| 3,215,570 | 11/1965 | Andrews | 148/188 |
| 3,519,900 | 7/1970 | Lawrence | 29/590 |
| 3,523,223 | 8/1970 | Luxem | 29/580 |
| 3,601,888 | 8/1971 | Engeler | 29/590 |
| 3,675,314 | 7/1972 | Levi | 29/580 |

*Primary Examiner*—W. Tupman
*Attorney, Agent, or Firm*—Richards, Harris & Medlock

[57] ABSTRACT

The specification discloses a method of fabricating a semiconductor diode which includes forming a layer of aluminum over a first exterior surface of a semiconductor body of N-type material. Impurities are then diffused from the aluminum layer into the body to form an area of P-type material which has a thickness greater than one half the thickness of the body. The periphery of the body is then etched from the side of the body opposite the layer of aluminum, in order to form an inwardly directed periphery contour. The sectional area of the body parallel to the exterior surfaces decreases in magnitude from the aluminum layer to the opposite exterior surface, such that the minimum sectional area of the body comprises the opposite exterior surface. The contoured periphery of the body is then filled with passivating material and an electrode is formed on the opposite exterior surface to form a semiconductor diode.

10 Claims, 4 Drawing Figures

METHOD OF FABRICATING A SEMICONDUCTOR DIODE HAVING HIGH VOLTAGE CHARACTERISTICS

FIELD OF THE INVENTION

This invention relates to semiconductor devices, and more particularly relates to a semiconductor diode having high voltage characteristics and the method for fabricating same.

THE PRIOR ART

Semiconductor diodes have been heretofore fabricated by diffusing a region of one conductivity type material into a body of the opposite conductivity type, and then attaching electrodes on opposed surfaces of the body. However, many previously developed semiconductor diodes have not had adequate high voltage operational characteristics. It has also heretofore been known to bevel the peripheral edges of semiconductor devices such as diodes, in order to provide improved voltage breakdown characteristics. For example, reference is made to U.S. Pat. No. 3,491,272 issued Jan. 20, 1970; U.S. Pat. No. 3,575,644 issued Apr. 20, 1971; and U.S. Pat. No. 3,697,829 issued Oct. 10, 1972. However, semiconductor diodes formed according to the techniques disclosed in the above-mentioned patents often are not provided with sufficient mechanical strength to adequately support glass passification and have thus not been able to withstand extremely high voltage conditions.

SUMMARY OF THE INVENTION

The present invention substantially reduces or eliminates many of the problems heretofore encountered in the fabrication and utilization of semiconductor diode devices. According to the present method, a layer of metal is formed over a first exterior surface of a semiconductor body of one conductivity type. Impurities are then diffused from the metal layer into the body to form a layer of opposite conductivity type having a thickness greater than one half the thickness of the body. The periphery of the body is then contoured inwardly such that the sectional area of the body parallel to the exterior surfaces diminishes toward the second exterior surface. The contoured periphery of the body is then filled with passivating material.

In accordance with another aspect of the invention, a method of forming a semiconductor diode includes forming a layer of aluminum over a first exterior surface of a semiconductor body of N-type conductivity having first and second opposed exterior surfaces. Impurities are then diffused from the aluminum layer into the body to form an area of P-type conductivity which has a thickness greater than one half the distance between the first and second exterior surfaces. Portions of the periphery of the body are then etched away to form an inwardly directed contour, wherein the sectional area of the body parallel to the exterior surfaces diminishes from the region of the first exterior surface in the direction of the second exterior surface. The minimum sectional area of the body thus comprises the second exterior surface. The contour periphery of the body is then filled with passivating material and an electrode is formed on the second exterior surface.

In accordance with another aspect of the invention, a method of fabricating a semiconductor device includes depositing a layer of aluminum over a first exterior surface of a semiconductor slice of one conductivity type and having first and second opposite exterior surfaces. Portions of the aluminum layer are then removed to define a plurality of first electrodes. Impurities are diffused into the body from the first electrodes to form an area of the opposite conductivity type extending to a depth past the midpoint of the thickness of the body. The slice is then severed into a plurality of elements each having one of the first electrodes. The peripheries of the elements are then etched from the second exterior surfaces to form inward peripheral contours such that the sectional areas of the elements decrease from the first electrodes to the second surfaces. The inward contours are then filled with passivating material and second electrodes are formed on the second surfaces to form a plurality of semiconductor diodes having high voltage characteristics.

DESCRIPTION OF THE DRAWINGS

For a more complete understanding of the present invention and for further objects and advantages thereof, reference is now made to the following description taken in conjunction with the accompanying drawings, in which.

DESCRIPTION OF THE PREFERRED EMBODIMENT

Figure 1:
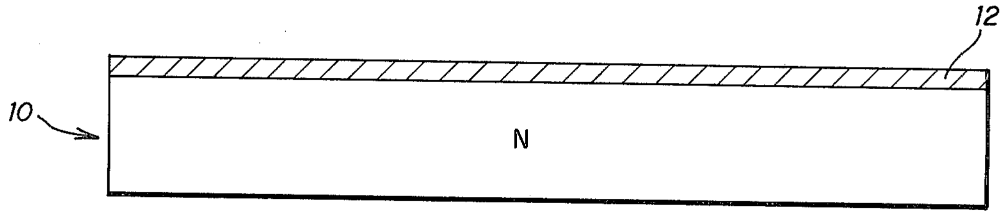
FIG. 1 is a sectional view of a semiconductor slice having a layer of aluminum formed thereon.

FIG. 1 illustrates a slice 10 of N-type conductivity material such as silicon. The geometry of the slice 10 may be circular or rectangular, with a typical thickness of the slice 10 being ten mils. A thin layer 12 of metal which may comprise aluminum or gallium is formed over the slice 10 by conventional techniques. In the preferred embodiment, a layer 12 of aluminum is evaporated upon the surface of the slice 10 to form a layer having a thickness of 5,000–10,000 A.

Figure 2:
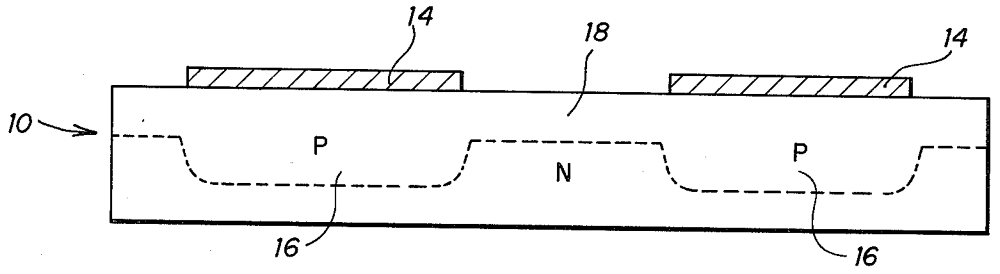
FIG. 2 is a sectional, somewhat diagrammatic, view of the body shown in FIG. 1 with portions of the aluminum layer removed and after being diffused with P-type impurities.

Referring to FIG. 2, the aluminum layer 12 is masked by suitable photo resist techniques and portions of the layer 12 are etched away, thereby leaving a plurality of discrete metal electrodes 14 spaced apart over the surface of the body 10. The formation of the discrete electrodes 14 is illustrated in FIG. 2 for clarity of illustration, although it will be understood that the present method may be accomplished with a continuous metal layer.

The body 10 bearing discrete electrodes 14 is placed in an open tube having a non-oxidizing atmosphere such as argon therein. The temperature of the body in the tube is then raised to approximately 1,250°C. and the body is subjected to diffusion from the aluminum layer 12 at saturation for approximately 100 hours.

An important aspect of the present invention is a diffusion phenomena wherein aluminum will diffuse from the aluminum electrodes 14 to a much greater extent than would impurities from a separate alloy source within a closed tube. Specifically, referring to FIG. 2, areas 16 of P-type material are formed beneath the electrodes 14 which have depths which extend past the midpoint of the thickness of the slice 10. Relatively shallow regions 18 of P-type material are formed where the layer 12 has been removed. In the specific process noted above, the aluminum diffuses into the silicon slice 10 in regions 16 to depths of approximately 6 to 8 mils, or well past the middle of the 10 mil slice 10. This deep diffusion would not occur at the times and temperatures noted above when diffusion is accomplished by a separate metal alloy source located in a closed tube environment.

Figure 3:
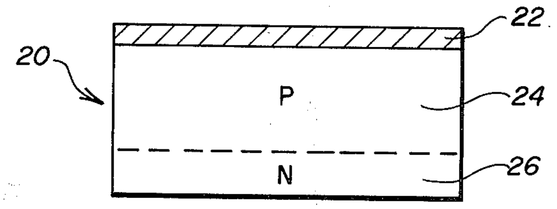
FIG. 3 is a sectional view of an element formed from a portion of the body shown in FIG. 2.

After diffusion of slice 10 as shown in FIG. 2, the slice 10 is severed into a plurality of elements 20 as shown in FIG. 3. Each element 20 includes a layer of aluminum 22 bonded to a P-type layer 24 which preferably has a thickness greater than one-half the total thickness of the element 20. An N-type layer 26 interfaces with layer 24 to form a P-N junction.

Figure 4:
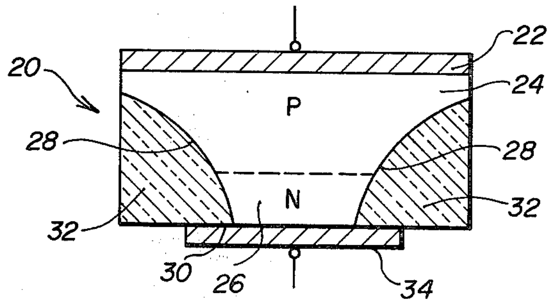
FIG. 4 is a sectional, somewhat diagrammatic, view of a finalized semiconductor diode formed from the element shown in FIG. 3.

The elements 20 are then suitably masked by conventional techniques and are etched at the peripheries from the side opposite the aluminum layer 22. The etching is accomplished with the use of a conventional etching composition including nitric acid, hydroflouic acid and/or acetic acid mixes to form a concave inwardly curved contour 28 about the periphery of the element 20. As shown in FIG. 4, etching from the side opposite the aluminum layer 22 tends to cause a generally semicircular cross-sectional shape of the periphery contour due to undercutting of the etching mixes. Etching of the inwardly directed contour of the periphery of the element 20 results in a diminishing horizontal area of the element toward the lower exterior surface 30. In the preferred embodiment, the surface 30 will then have the minimum cross-sectional area within the entire element. This peripheral etching, in combination with the deep diffusion grading phenomena described above, results in a very high voltage diode device.

Moreover, the etching operation provides a device with substantial mechanical strength which may support passivating material 32, such as glass, which is used to fill the exterior portions of the periphery of the device. After filling of the contoured periphery with passivating material 32, a second electrode 34 is formed over the surface 30 of the device in the conventional manner. The device may then be operated as a conventional two terminal P-N diode.

Whereas the present invention has been described with respect to specific embodiments thereof, it will be understood that various changes and modifications will be suggested to one skilled in the art, and it is intended to encompass such changes and modifications as fall within the scope of the appended claims.

What is claimed is:

1. A method of fabricating a semiconductor device comprising:

forming a patterned layer of metal over a first exterior surface of a semiconductor body of one conductivity type having first and second opposed exterior surfaces, diffusing impurities into said body to form an area of the opposite conductivity type having a relatively large thickness beneath said layer of metal wherein the formed p-n junction below said metal layer is closer to said second surface, inwardly contouring the periphery of said body below said patterned layer such that the sectional area of said body parallel to said exterior surfaces diminishes from the region of said diffused area at said first exterior surface to said second exterior surface, filling the contoured periphery of said body with passivating material, and applying an electrode to said second exterior surface.

2. The method of claim 1 wherein said step of contouring comprises:

etching the periphery of said body by applying an etching material to the peripheral portions of said second exterior surface.

3. The method of claim 1 wherein said layer of metal comprises aluminum.

4. The method of claim 1 wherein the contoured periphery of said body has a semicircular configuration and wherein said layer of metal comprises gallium.

5. A method of fabricating a semiconductor diode having improved voltage breakdown characteristics comprising:

forming a layer of aluminum over a first exterior surface of a semiconductor body of one conductivity type having first and second opposed exterior surfaces, diffusing impurities from said aluminum layer through said first exterior surface into said body to form an area of the opposite conductivity type which has a thickness greater than one half the distance between said first and second exterior surfaces wherein the formed p-n junction is closer to said second surface, etching away portions of the periphery of said body to form an inwardly directed contour, wherein the sectional area of said body parallel to said exterior surfaces diminishes from the region of said diffused area at said first exterior surface to said second exterior surface, the minimum sectional area of said body comprising said second exterior surface, filling the contoured periphery of said body with passivating material, and forming an electrode on said second exterior surface to form a passivated diode of substantial mechanical strength and of improved voltage breakdown characteristics.

6. The method of claim 5 wherein said body is of N-type conductivity material and said diffused ares is P-type conductivity material.

7. The method of claim 5 wherein said impurities comprise gaseous aluminum.

8. A method of fabricating semiconductor devices having improved voltage breakdown characteristics comprising:

depositing a layer of aluminum over a first exterior surface of a semiconductor slice of one conductivity type having first and second opposite exterior surfaces, removing portions of said aluminum layer to define a plurality of first electrodes, diffusing impurities into said body from said first electrodes and said first exterior surface to form an area of the opposite conductivity type, said first electrodes causing diffusion of said opposite conductivity type under said first electrodes to depths past the midpoint of the thickness of said body wherein the formed p-n junction is closer to said second surface, severing said slice into a plurality of elements each having one of said first electrodes, etching the peripheries of said elements from said second exterior surfaces to form inward peripheral contours such that the sectional areas of said elements decrease from the region of said diffused area at said first electrodes to said second surfaces, filling said inward contours with passivating material, and forming second electrodes on said second surfaces to form a plurality of devices having improved voltage breakdown characteristics and of substantial mechanical strength.

9. The method of claim 8 wherein said impurities emanate from gaseous aluminum.

10. The method of claim 8 wherein said semiconductor slice comprises N-type semiconductor material and wherein said diffused area comprises P-type semiconductor material.

* * * * *